United States Patent
Hwang

(10) Patent No.: US 10,153,013 B2
(45) Date of Patent: Dec. 11, 2018

(54) DATA OUTPUT BUFFER

(71) Applicant: SK hynix Inc., Icheon-si, Gyeonggi-do (KR)

(72) Inventor: Mi Hyun Hwang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 16 days.

(21) Appl. No.: 15/645,012

(22) Filed: Jul. 10, 2017

(65) Prior Publication Data
US 2018/0233179 A1 Aug. 16, 2018

(30) Foreign Application Priority Data
Feb. 13, 2017 (KR) .......................... 10-2017-0019266

(51) Int. Cl.
*G11C 7/10* (2006.01)
*G11C 29/12* (2006.01)
*G11C 29/08* (2006.01)

(52) U.S. Cl.
CPC ........ *G11C 7/1057* (2013.01); *G11C 29/1201* (2013.01); *G11C 29/08* (2013.01)

(58) Field of Classification Search
CPC .............................. G11C 7/1057; G11C 29/08
See application file for complete search history.

(56) References Cited

U.S. PATENT DOCUMENTS

| | | | |
|---|---|---|---|
| 7,053,660 B2 * | 5/2006 | Itoh | H03K 17/167 326/27 |
| 7,737,712 B2 | 6/2010 | Kim et al. | |
| 7,821,281 B2 * | 10/2010 | Chen | G01R 31/2853 324/750.3 |
| 2011/0267112 A1 * | 11/2011 | Lee | H03K 19/018528 327/108 |
| 2012/0099383 A1 * | 4/2012 | Kim | G11C 7/1057 365/189.02 |
| 2015/0016200 A1 * | 1/2015 | Cha | G11C 7/1009 365/189.11 |

FOREIGN PATENT DOCUMENTS

KR   20140064461 A   5/2014

* cited by examiner

*Primary Examiner* — Tri Hoang
(74) *Attorney, Agent, or Firm* — William Park & Associates Ltd.

(57) ABSTRACT

A data output buffer may be provided. The data output buffer may include a pull-up circuit configured to output a pull-up feedback signal by pull-up driving an output node. The data output buffer may include a pull-up driver configured to output the pull-up drive signal by driving a pull-up signal, and selectively activate the pull-up drive signal based on the pull-up feedback signal. The data output buffer may include a pull-down circuit configured to output a pull-down feedback signal by pull-down driving the output node based on a pull-down drive signal. The data output buffer may include a pull-down driver configured to output the pull-down drive signal by driving a pull-down signal, and selectively activate the pull-down drive signal based on the pull-down feedback signal.

20 Claims, 7 Drawing Sheets

DATA OUTPUT BUFFER

CROSS-REFERENCE TO RELATED APPLICATION

This application claims priority based upon Korean patent application No. 10-2017-0019266, filed on Feb. 13, 2017, the disclosure of which is hereby incorporated in its entirety by reference herein.

BACKGROUND

1. Technical Field

Embodiments of the present disclosure may generally relate to a buffer, and more particularly to a data output buffer.

2. Related Art

Various semiconductor devices (e.g., CPU, memory, gate array, etc.) implemented as integrated circuit (IC) chips are incorporated into various electrical products, for example, personal computers (PC), servers, workstations, etc. Generally, the semiconductor device includes a reception circuit configured to receive various signals from the outside through an input pad, and an output circuit configured to transmit internal signals to the outside through an output pad.

A device for outputting one or more signals to the outside through the semiconductor device is referred to as a driver, and the semiconductor device normally operates only when the driver normally transmits signals to the external devices. As the demand of highly-integrated and super-miniaturized semiconductor devices is rapidly increasing, the pad for coupling the semiconductor device to the external device is gradually reduced in size. A micro-bump pad from among small-sized pads has been widely used as a package ball.

However, the micro-bump pad is very small in size, such that the micro-bump has difficulty in discriminating between a defective (or failed) part caused by a damage of the actual package ball and a defective part caused by misalignment between a socket of a test device and a package ball. Therefore, although the actual package ball is not damaged during testing of the semiconductor device, occurrence of a defective part is screened, resulting in reduction of productivity of the semiconductor device.

SUMMARY

In accordance with an embodiment of the present disclosure, a data output buffer may be provided. The data output buffer may include a pull-up circuit configured to output a pull-up feedback signal by pull-up driving an output node. The data output buffer may include a pull-up driver configured to output the pull-up drive signal by driving a pull-up signal, and selectively activate the pull-up drive signal based on the pull-up feedback signal. The data output buffer may include a pull-down circuit configured to output a pull-down feedback signal by pull-down driving the output node based on a pull-down drive signal. The data output buffer may include a pull-down driver configured to output the pull-down drive signal by driving a pull-down signal, and selectively activate the pull-down drive signal based on the pull-down feedback signal.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments of the present disclosure may be directed to providing a data output buffer that substantially obviates one or more problems due to limitations and disadvantages of the related art.

Various embodiments of the present disclosure may generally relate to a technology for discriminating between a true defective part of a package ball and a false defective part caused by a contact issue during testing of current characteristics of a data output buffer.

Figure 1:
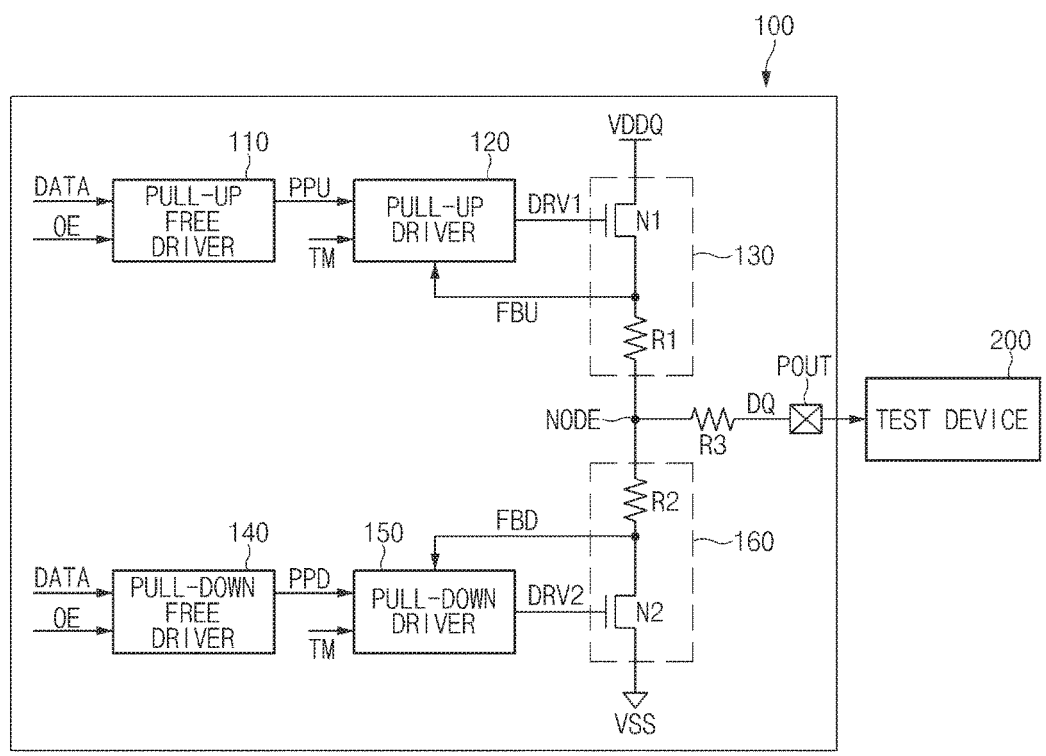
FIG. 1 is a block diagram illustrating a representation of an example of a data output buffer according to an embodiment of the present disclosure.

FIG. 1 is a block diagram illustrating a representation of an example of a data output buffer according to an embodiment of the present disclosure.

Data stored in the data output buffer according to the embodiment of the present disclosure may be classified into a high level H and a low level L in response to a voltage level, and the high-level data and the low-level data may be denoted by "1" and "0", respectively. In this case, such data values may be differentially classified into different values according to a voltage level and a current magnitude. In the case of binary data, a high level may be defined as a high voltage, and a low level may be defined as a low voltage lower than the high level. In addition, the NMOS transistor may be represented by a pull-down driving element.

Referring to FIG. 1, the data output buffer 100 according to an embodiment of the present disclosure may include a pull-up free driver 110, a pull-up driver 120, a pull-up circuit 130, a pull-down free driver 140, a pull-down driver 150, a pull-down circuit 160, an output resistor R3, and an output pad POUT.

In this case, the pull-up free driver 110 may output a pull-up signal PPU by driving data DATA in response to an output enable signal OE. The pull-up driver 120 may output a pull-up drive signal DRV1 by driving the pull-up signal PPU according to a test signal TM. The pull-up driver 120 may control an activation state of the pull-up drive signal DRV1 in response to a pull-up feedback signal FBU received from the pull-up circuit 130.

In addition, the pull-up circuit 130 may pull up an output node NODE to a power-supply voltage (VDDQ) level in response to the pull-up drive signal DRV1. The pull-up circuit 130 may output the pull-up feedback signal FBU to the pull-up driver 120.

The pull-up circuit 130 may include an NMOS transistor N1 acting as a pull-up driving element and a resistor R1. The NMOS transistor N1 may be disposed between the power-supply voltage (VDDQ) input terminal and the resistor R1, and may receive the pull-up drive signal DRV1 through a gate terminal thereof. The resistor R1 may be disposed between the NMOS transistor N1 and the output node NODE. In this case, for example, the resistor R1 may be required for electrostatic discharge (ESD).

The pull-down free driver 140 may output the pull-down signal PPD by driving data DATA in response to the output enable signal OE. The pull-down driver 150 may output a pull-down drive signal DRV2 by driving the pull-down signal PPD according to the test signal TM. The pull-down driver 150 may control an activation state of the pull-down drive signal DRV2 in response to a pull-down feedback signal FBD received from the pull-down circuit 160.

The pull-down circuit 160 may pull down the output node NODE to a ground voltage (VSS) level in response to the drive signal DRV2. The pull-down circuit 160 may output the pull-down feedback signal FBD to the pull-down driver 150.

The pull-down circuit 160 may include an NMOS transistor N2 acting as a pull-down driving element and a resistor R2. The NMOS transistor N2 may be disposed between the resistor R2 and the ground voltage (VSS) input terminal, and may receive the pull-down drive signal DRV2 through a gate terminal thereof. The resistor R2 may be disposed between the output node NODE and the NMOS transistor N2. In this case, for example, the resistor R2 may be required for electrostatic discharge (ESD).

The output resistor R3 may be coupled between the output node NODE and the output pad POUT. In addition, the output pad POUT may output data DQ received through the output node NODE to the external test device 200. The output pad POUT may be coupled to the package ball through wires.

With the increasing development of semiconductor technology, the demand of smaller-sized packages is rapidly increasing. In the semiconductor device, input and output (I/O) Buffer Interface Specification (IBIS) of the pull-up circuit 130 and the pull-down circuit 160 of the data output buffer 100 may be measured through the package ball. In this case, the package ball may be coupled to the output pad POUT. The test device 200 may measure the amount of a current of the data output buffer 100 through the package ball, and may thus estimate characteristics of the driver.

However, as the package is gradually reduced in size, distance between the package balls is also gradually reduced. As a result, the distance between the socket of the test device 200 and the package ball is gradually reduced, such that misalignment occurs. Therefore, a resistance value is gradually increased, such that a current flowing in the package ball is gradually reduced. In this case, the package ball is not damaged. If alignment of the package ball is re-adjusted and re-measured, the current can be normally measured.

However, it is impossible to re-measure the current of the package ball during testing of the semiconductor device, such that overscreen occurs due to limitation of a current screen, resulting in reduction of productivity of semiconductor elements. That is, a low current may be measured due to a contact resistance between the package ball and the test device 200 although the actual package ball is not damaged, such that the package ball may be screened as a defective package ball.

Therefore, various embodiments of the present disclosure can prevent occurrence of overscreen caused by misalignment. That is, various embodiments of the present disclosure may discriminate between a true defective part of the package ball and a false defective part caused by contact resistance according to a pull-up feedback signal FBU being fed back to the pull-up driver 120 and a pull-down feedback signal FBD being fed back to the pull-down driver 150.

If a true defective part occurs in the package ball by measuring a voltage of the pull-up feedback signal FBU and a voltage of the pull-down feedback signal FBD, operations of the pull-up circuit 130 and the pull-down circuit 160 are blocked, such that an IBIS transmission path is also cut off.

Figure 2:
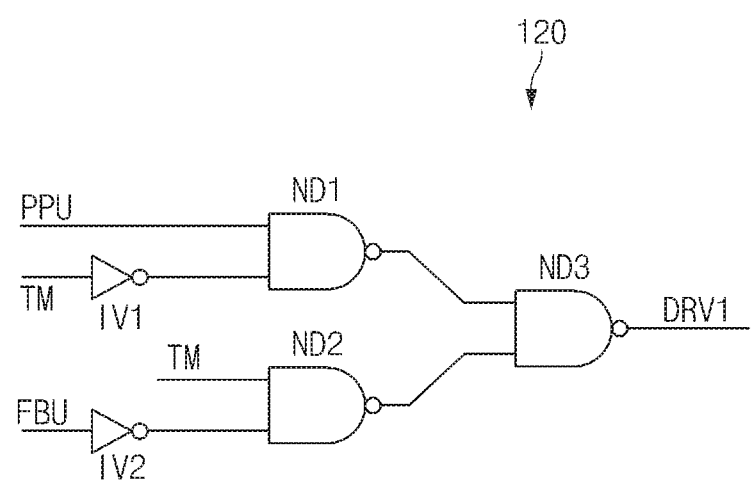
FIG. 2 is a circuit diagram illustrating a representation of an example of a pull-up driver illustrated in FIG. 1.

FIG. 2 is a circuit diagram illustrating a representation of an example of the pull-up driver 120 illustrated in FIG. 1 according to an embodiment of the present disclosure.

Referring to FIG. 2, the pull-up driver 120 may control a logic level of the pull-up drive signal DRV1 by combining the pull-up signal PPU and the pull-up feedback signal FBU according to the test signal TM. The pull-up driver 120 may deactivate the pull-up drive signal DRV1 to a logic low level when the test signal TM is activated, irrespective of the pull-up signal PPU. However, the pull-up driver 120 may control a logic level of the pull-up drive signal DRV1 in response to the pull-up signal PPU when the test signal TM is deactivated.

The pull-up driver 120 may include a plurality of inverters IV1 and IV2 and a plurality of NAND gates ND1~ND3. The NAND gate ND1 may perform a NAND operation between the pull-up signal PPU and the test signal TM inverted by the inverter IV1. The NAND gate ND2 may perform a NAND operation between the test signal TM and the pull-up feedback signal FBU inverted by the inverter IV2. The NAND gate ND3 may perform a NAND operation between the output signals of the NAND gates ND1 and ND2, and may thus output the pull-up drive signal DRV1.

For example, it is assumed that the test signal TM is activated to a logic high level. Assuming that the pull-up signal PPU and the pull-up feedback signal FBU are at a logic high level, the output signals of the NAND gates ND1 and ND2 are at a logic high level. As a result, the pull-up drive signal DRV1 corresponding to the output signal of the NAND gate ND3 may be at a logic low level.

During the normal operation mode, the NMOS transistor N1 of the pull-up circuit 130 is turned on, such that the node NODE is at a logic high level. However, during the test mode, the pull-up drive signal DRV1 is at a logic low level and the NMOS transistor N1 is turned off, such that a current level of the node NODE is reduced.

That is, assuming that the resistor R3 has a high resistance value during the test mode, the pull-up feedback signal FBU is at a logic high level and the pull-up circuit 130 stops operation, such that the pull-up current does not flow in the node NODE. Assuming that the value of the resistor R3 is reduced, the pull-up feedback signal FBU may transition to a logic low level, such that the pull-up circuit 130 may re-operate.

Figure 3:
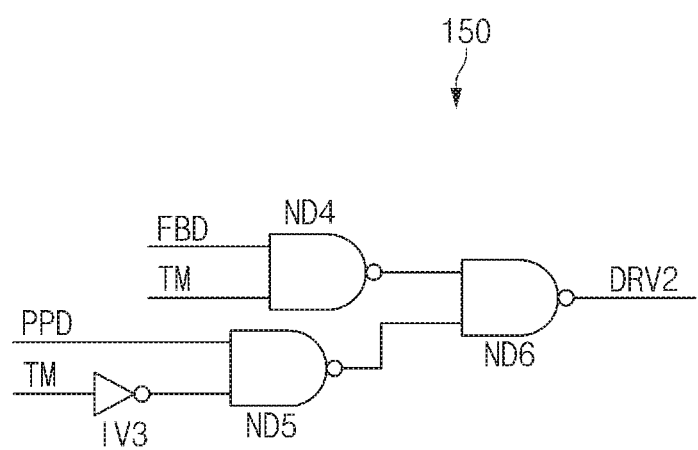
FIG. 3 is a circuit diagram illustrating a representation of an example of a pull-down driver illustrated in FIG. 1.

FIG. 3 is a circuit diagram illustrating a representation of an example of the pull-down driver 150 illustrated in FIG. 1.

Referring to FIG. 3, the pull-down driver 150 may control a logic level of the pull-down drive signal DRV2 by combining the pull-down signal PPD and the pull-down feedback signal FBD according to the test signal TM. The pull-down driver 150 may deactivate the pull-down drive signal DRV2 to a logic low level when the test signal TM is activated, irrespective of the pull-down signal PPD. However, the pull-down driver 150 may control a logic level of the pull-down drive signal DRV2 in response to the pull-down signal PPD when the test signal TM is deactivated.

The pull-down driver 150 may include an inverter IV3 and a plurality of NAND gates ND4~ND6. The NAND gate ND4 may perform a NAND operation between the test signal TM and the pull-down feedback signal FBD. The NAND gate ND5 may perform a NAND operation between the pull-down signal PPD and the test signal TM inverted by the inverter IV3. In addition, the NAND gate ND6 may perform a NAND operation between the output signals of the NAND gates ND4 and ND5, and may thus output the pull-down drive signal DRV2.

For example, it is assumed that the test signal TM is activated to a logic high level. Assuming that the pull-down signal PPD is at a logic high level and the pull-down feedback signal FBD is at a logic low level, the output signals of the NAND gates ND4 and ND5 are at a logic high level. As a result, the pull-down drive signal DRV2 corresponding to the output signal of the NAND gate ND6 may be at a logic low level.

During the normal operation mode, the NMOS transistor N2 of the pull-down circuit 160 is turned on, such that the node NODE is at a logic low level. If the test signal TM is activated during the test mode, the pull-down drive signal DRV2 is at a logic low level and the NMOS transistor N2 of the pull-down circuit 160 is turned off, such that a current level of the node NODE is reduced.

That is, assuming that the resistor R3 has a high resistance value during the test mode, the pull-down feedback signal FBD is at a logic low level and the operation of the pull-down circuit 160 is blocked, such that the pull-down current does not flow into the node NODE. If the resistance value of the resistor R3 is reduced again, the pull-down feedback signal FBD transitions to a logic high level, such that the pull-down circuit 160 can re-operate.

Figure 4:
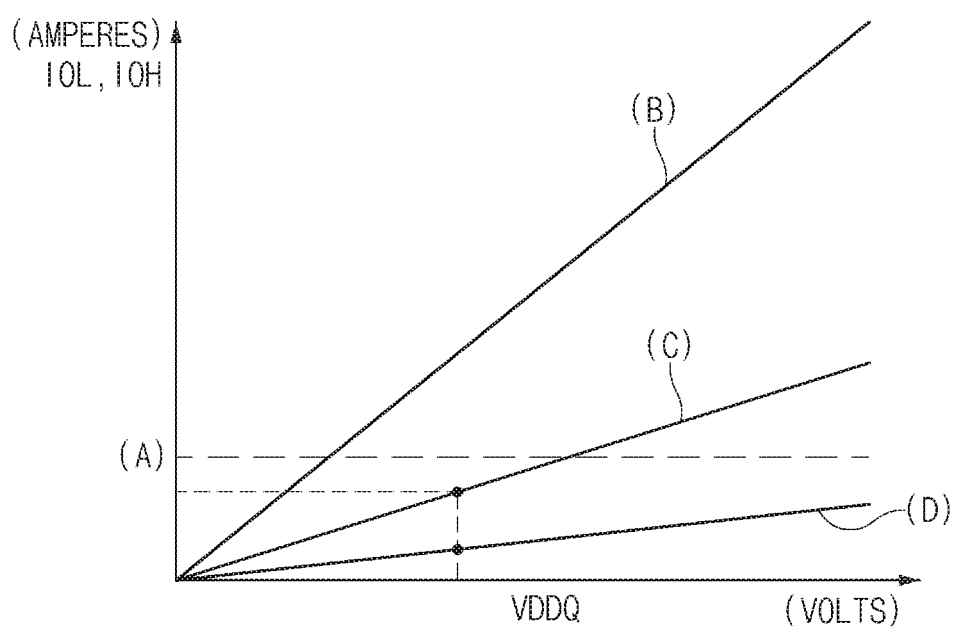
FIGS. 4 and 5 are graphs illustrating test operations of the data output buffer according to an embodiment of the present disclosure.
Figure 5:
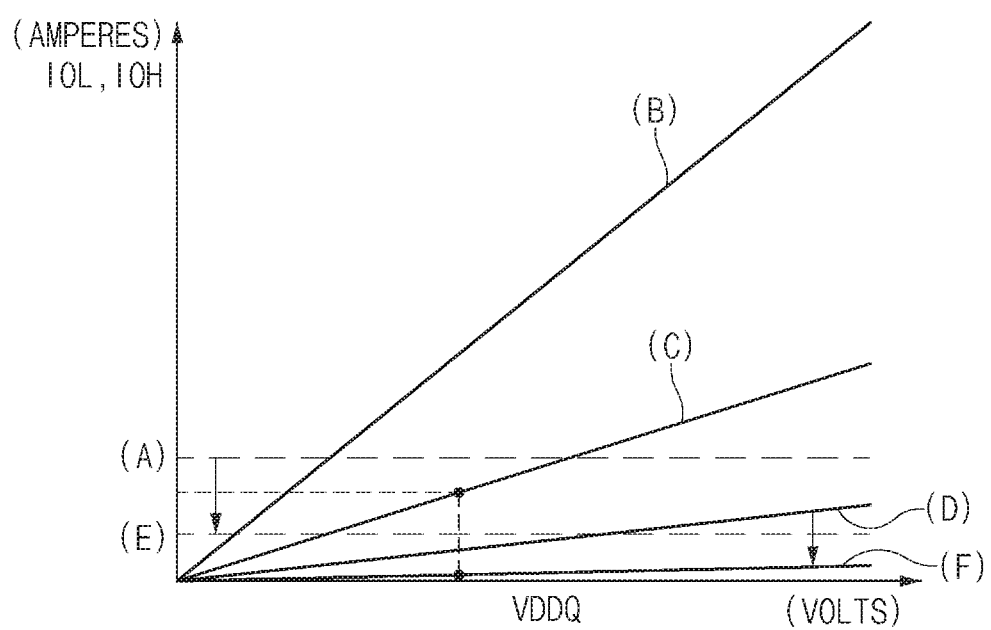

FIGS. 4 and 5 are graphs illustrating test operations of the data output buffer according to an embodiment of the present disclosure. For both FIGS. 4 and 5 the y-axis is measured in amperes and the x-axis is measured in volts.

The graph illustrated in FIG. 4 may indicate a current IOH measured by the pull-up circuit 130 and a current IOL measured by the pull-down circuit 160. A power-supply voltage VDDQ may indicate a power-supply voltage supplied to the data output buffer 100.

In FIG. 4, (A) may represent an IBIS current value that is set to a screen limit to screen a defective part of the package ball. In FIG. 4, (B) may represent a normal state having no defective part, and (C) may represent a case, for example, in which misalignment occurs between the socket of the test device 200 and the package ball such that a resistance value is gradually increased and a current value is gradually reduced.

In FIG. 4, (D) may represent a case, for example, in which a true defective part occurs in the package ball and a self-resistance value increases such that low values of the currents IOL and IOH are respectively measured. An external contact resistance component coupled to the output pad POUT on the condition that the package ball is damaged will hereinafter be referred to as the resistor R3. If the package ball is damaged, a resistance value of the resistor R3 is increased, such that values of the currents IOH and IOL are respectively reduced as illustrated in FIG. 4(D).

However, even when the actual package ball is not damaged and misalignment occurs, a low current value may be measured as illustrated in FIG. 4(C). In other words, assuming that misalignment occurs as illustrated in FIG. 4(C), whereas a lower resistance value may occur as compared to a case in which the package ball is damaged, a higher resistance value may occur as compared to a normal state of the package ball. Assuming that the screen current has the value (A), if a misalignment state occurs as illustrated in FIG. 4(C), a current value may be measured to be a lower than the screen limit (A), such that a defective part may be screened.

Therefore, an embodiment of the present disclosure can prevent occurrence of overscreen caused by misalignment as illustrated in FIG. 5. That is, an embodiment of the present disclosure may determine the presence or absence of a true defective part in the package ball in response to the pull-up feedback signal FBU fed back to the pull-up driver 120 and the pull-down feedback signal fed back to the pull-down driver 150.

If a true defective part occurs in the package ball, the operations of the pull-up circuit 130 and the pull-down circuit 160 are blocked such that a current (IBIS) flowing into the output node NODE may be reduced as illustrated in FIG. 5(F). In this case, the limit value of a screen current is reduced as illustrated in FIG. 5(E), such that a defective part caused by misalignment and another defective part caused by damage of the package ball can be distinguished from each other.

That is, assuming that the detected current value is higher than a current value of FIG. 5(E), the test device 200 may determine the presence of a defective part caused by misalignment such that the test device 200 can save (or rescue) the determined defective part. Assuming that the detected current value is lower than a current value of FIG. 5(E), the test device 200 may determine the presence of a true defective part in the package ball as illustrated in FIG. 5(F).

Figure 6:
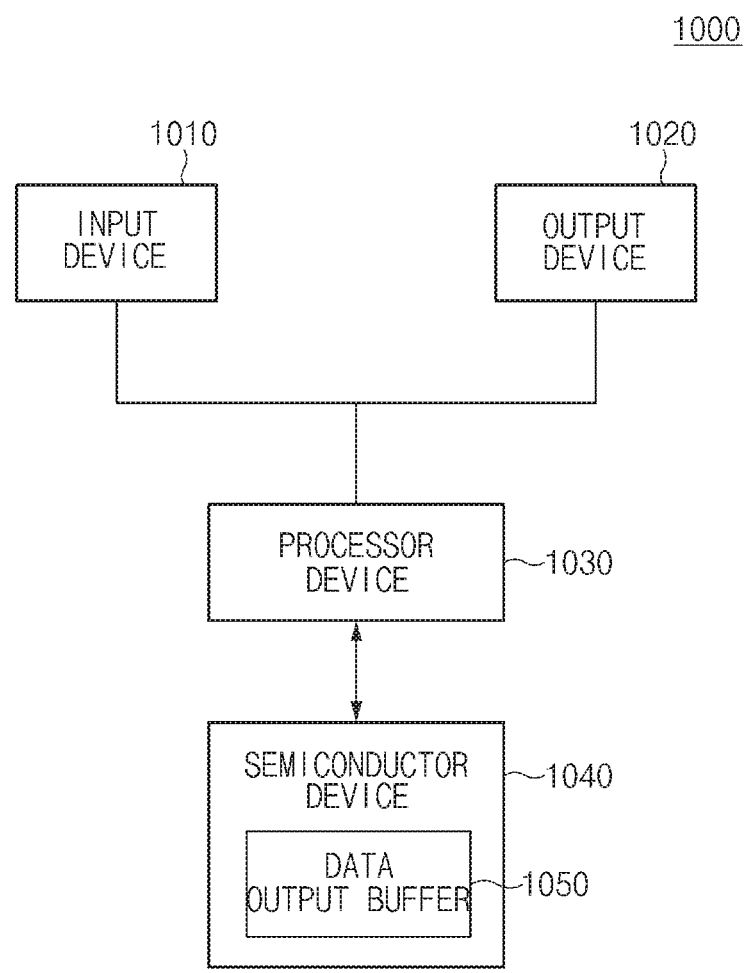
FIG. 6 is a block diagram illustrating a representation of an application example of an electronic system including the data output buffer according to an embodiment of the present disclosure.

FIG. 6 is a block diagram illustrating an application example of an electronic system including the data output buffer according to an embodiment of the present disclosure.

Referring to FIG. 6, the electronic system 1000 may include an input device 1010, an output device 1020, a processor device 1030, and a semiconductor device 1040. In this case, the processor device 1030 may control the input device 1010, the output device 1020, and the semiconductor device 1040 through the corresponding interfaces.

The processor device 1030 may include at least any one of at least one microprocessor, at least one digital signal processor, at least one microcontroller, and logic circuits capable of performing the same or similar functions as these components.

The input device 1010 may include at least one selected among a keyboard, a mouse, a keypad, a touchscreen, a scanner, and so forth. The output device 1020 may include at least one selected among a monitor, a speaker, a printer, a display device, and so forth. The semiconductor device 1040 may include the data output buffer 1050 described in the aforementioned embodiments.

Figure 7:
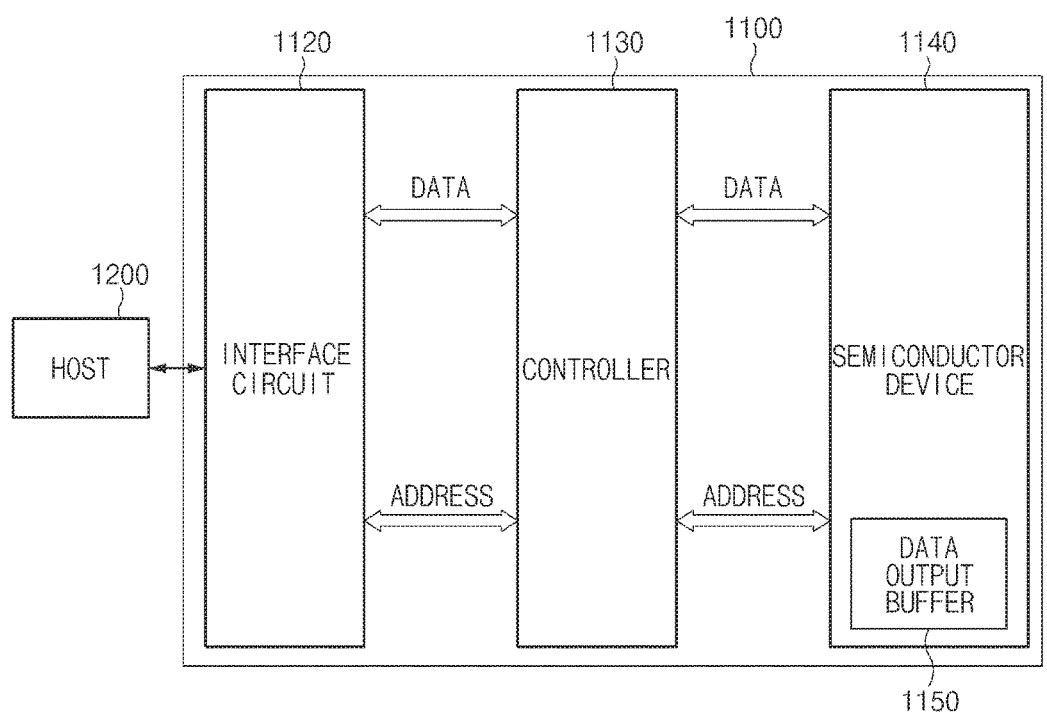
FIG. 7 is a block diagram illustrating a representation of an example of a memory system based on the semiconductor device according to an embodiment of the present disclosure.

FIG. 7 is a block diagram illustrating a representation of an example of a memory system using the semiconductor device according to an embodiment of the present disclosure.

Referring to FIG. 7, the memory system 1100 may include a semiconductor device 1140, an interface circuit 1120, and a controller 1130.

The interface circuit 1120 may provide interfacing between the memory system 1100 and the host 1200. The interface unit 1120 may include a data exchange protocol corresponding to the host 1200 to interface with the host 1200.

The interface circuit 1120 may be configured to communicate with the host 1200 through one of various interface protocols, for example but not limited to, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address from an external part through the interface circuit 1120. The controller 1130 may access the semiconductor device 1140 by referring to data and an address received from the host 1200. The controller 1130 may transfer data read from the semiconductor device 1140 to the host 1200 through the interface circuit 1120.

The semiconductor device 1140 may include the data output buffers 1150 illustrated in FIGS. 1 to 3. The semiconductor device 1140 may be used as a storage medium of the memory system 1100.

The memory system 1100 illustrated in FIG. 7 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCMCIA) card, a chip card, a USB card, a smart card, a Compact Flash (CF) Card, etc.

As is apparent from the above description, the data output buffers according to the embodiments of the present disclosure can discriminate between a true defective part of a package ball and a false defective part caused by a contact issue when characteristics of a current of the data output buffer are tested, such that the data output buffers can save (or rescue) the false defective part caused by contact resistance of a test device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A data output buffer comprising:
   a pull-up circuit coupled between a power-supply voltage input terminal and an output node, and configured to output a pull-up feedback signal by pull-up driving the output node in response to a pull-up drive signal;
   a pull-up driver configured to output the pull-up drive signal by driving a pull-up signal, and selectively activate the pull-up drive signal in response to the pull-up feedback signal during a test mode;
   a pull-down circuit coupled between a ground voltage input terminal and the output node, and configured to output a pull-down feedback signal by pull-down driving the output node in response to a pull-down drive signal; and
   a pull-down driver configured to output the pull-down drive signal by driving a pull-down signal, and selectively activate the pull-down drive signal in response to the pull-down feedback signal during the test mode.

2. The data output buffer according to claim 1, wherein operations of the pull-up driver are blocked and the pull-up drive signal is deactivated when a test signal is activated and the pull-up feedback signal is at a logic high level, and thus blocks a path of a pull-up current from flowing into the output node.

3. The data output buffer according to claim 1, wherein the pull-up driver includes:
   a first logic gate configured to perform a NAND operation between the pull-up signal and an inversion signal of a test signal;
   a second logic gate configured to perform a NAND operation between the test signal and an inversion signal of the pull-up feedback signal; and
   a third logic gate configured to output the pull-up drive signal by performing a NAND operation between an output signal of the first logic gate and an output signal of the second logic gate.

4. The data output buffer according to claim 1, wherein operations of the pull-down driver are blocked and the pull-down drive signal is deactivated when a test signal is activated and the pull-down feedback signal is at a logic low level, and thus blocks a path of a pull-down current from flowing into the output node.

5. The data output buffer according to claim 1, wherein the pull-down driver includes:
   a fourth logic gate configured to perform a NAND operation between the pull-down feedback signal and a test signal;
   a fifth logic gate configured to perform a NAND operation between an inversion signal of the test signal and the pull-down signal; and a sixth logic gate configured to output the pull-down drive signal by performing a NAND operation between an output signal of the fourth logic gate and an output signal of the fifth logic gate.

6. The data output buffer according to claim 1, further comprising:
   a pull-up free driver configured to generate the pull-up signal;
   wherein the pull-up free driver generates the pull-up signal by driving data in response to an output enable signal.

7. The data output buffer according to claim 1, further comprising:
   a pull-down free driver configured to generate the pull-down signal;
   wherein the pull-down free driver generates the pull-down signal by driving data in response to an output enable signal.

8. The data output buffer according to claim 1, wherein the pull-up circuit includes:
   a first pull-up drive element coupled to the power-supply voltage input terminal, and controlled by the pull-up drive signal to output the pull-up feedback signal; and
   a first resistor coupled between the first pull-up drive element and the output node.

9. The data output buffer according to claim 1, wherein the pull-down circuit includes:
   a second pull-down drive element coupled to the ground voltage input terminal, and controlled by the pull-down drive signal to output the pull-down feedback signal; and
   a second resistor coupled between the second pull-down drive element and the output node.

10. The data output buffer according to claim 1, further comprising:
    an output pad coupled to the output node and configured to output data, to an external of the data output buffer, received through the output node.

11. A data output buffer comprising:
    a pull-up circuit coupled between a power-supply voltage and an output node, and configured to output a pull-up feedback signal by pull-up driving the output node based on a pull-up drive signal; and
    a pull-up driver configured to output the pull-up drive signal by driving a pull-up signal, and selectively activate the pull-up drive signal based on the pull-up feedback signal during a test mode.

12. The data output buffer according to claim 11, wherein operations of the pull-up driver are blocked and the pull-up drive signal is deactivated when a test signal is activated and the pull-up feedback signal is at a first logic level, and thus blocks a path of a pull-up current from flowing into the output node.

13. The data output buffer according to claim 11, wherein the pull-up driver includes:
    a first logic gate configured to perform a NAND operation between the pull-up signal and an inversion signal of a test signal;
    a second logic gate configured to perform a NAND operation between the test signal and an inversion signal of the pull-up feedback signal; and
    a third logic gate configured to output the pull-up drive signal by performing a NAND operation between an output signal of the first logic gate and an output signal of the second logic gate.

14. The data output buffer according to claim 11, wherein the pull-up circuit includes:
    a pull-up drive element coupled to the power-supply voltage input terminal, and controlled by the pull-up drive signal to output the pull-up feedback signal; and
    a resistor coupled between the pull-up drive element and the output node.

15. The data output buffer according to claim 11, further comprising:
    an output pad coupled to the output node and configured to output data, to an external of the data output buffer, received through the output node.

16. A data output buffer comprising:
    a pull-down circuit coupled between a ground voltage and an output node, and configured to output a pull-down feedback signal by pull-down driving the output node based on a pull-down drive signal; and
    a pull-down driver configured to output the pull-down drive signal by driving a pull-down signal, and selectively activate the pull-down drive signal based on the pull-down feedback signal during a test mode.

17. The data output buffer according to claim 16, wherein operations of the pull-down driver are blocked and the pull-down drive signal is deactivated when a test signal is activated and the pull-down feedback signal is at a first logic level, and thus blocks a path of a pull-down current from flowing into the output node.

18. The data output buffer according to claim 16, wherein the pull-down driver includes:
    a first logic gate configured to perform a NAND operation between the pull-down signal and an inversion signal of a test signal;
    a second logic gate configured to perform a NAND operation between the test signal and an inversion signal of the pull-down feedback signal; and
    a third logic gate configured to output the pull-down drive signal by performing a NAND operation between an output signal of the first logic gate and an output signal of the second logic gate.

19. The data output buffer according to claim 16, wherein the pull-down circuit includes:
    a pull-down drive element coupled to the ground voltage input terminal, and controlled by the pull-down drive signal to output the pull-down feedback signal; and
    a resistor coupled between the pull-down drive element and the output node.

20. The data output buffer according to claim 16, further comprising:
    an output pad coupled to the output node and configured to output data, to an external of the data output buffer, received through the output node.

* * * * *